United States Patent
Zhu et al.

(10) Patent No.: US 9,195,298 B2
(45) Date of Patent: Nov. 24, 2015

(54) SLEEP MODE CIRCUIT AND A METHOD FOR PLACING A CIRCUIT INTO SLEEP MODE

(71) Applicant: Beken Corporation, Shanghai (CN)

(72) Inventors: Lizhen Zhu, Shanghai (CN); Ronghui Kong, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 308 days.

(21) Appl. No.: 13/911,087

(22) Filed: Jun. 6, 2013

(65) Prior Publication Data

US 2014/0333362 A1 Nov. 13, 2014

(30) Foreign Application Priority Data

May 8, 2013 (CN) .......................... 2013 1 0167401

(51) Int. Cl.
*G06F 1/32* (2006.01)
*H03K 3/01* (2006.01)
*H03K 3/012* (2006.01)
*H03K 19/00* (2006.01)

(52) U.S. Cl.
CPC ............ *G06F 1/3287* (2013.01); *G06F 1/3206* (2013.01); *H03K 3/012* (2013.01); *H03K 19/0016* (2013.01)

(58) Field of Classification Search
CPC ...... G06F 1/3287; G06F 1/3206; H03K 3/012
See application file for complete search history.

(56) References Cited

U.S. PATENT DOCUMENTS

| | | | |
|---|---|---|---|
| 5,212,373 A * | 5/1993 | Fujioka et al. | 235/492 |
| 6,342,738 B1 * | 1/2002 | Lutnaes | 307/125 |
| 7,809,961 B2 * | 10/2010 | Dahan et al. | 713/300 |
| 2006/0128348 A1 * | 6/2006 | Jang | 455/343.1 |

* cited by examiner

*Primary Examiner* — Stefan Stoynov
(74) *Attorney, Agent, or Firm* — Perkins Coie LLP

(57) ABSTRACT

A first circuit is configured to communicatively couple to a second circuit including an analog circuit and a digital circuit. The first circuit comprises a lock unit and a sleep unit. The lock unit is configured to receive a lock enable signal and to lock a configuration signal of the digital circuit in response to the lock enable signal. The sleep unit is configured to receive a sleep triggering signal indicating to switch into sleep mode and to generate an off signal to switch off the digital circuit in response to the sleep triggering signal, while the analog circuit remains on.

12 Claims, 15 Drawing Sheets

SLEEP MODE CIRCUIT AND A METHOD FOR PLACING A CIRCUIT INTO SLEEP MODE

CLAIM OF PRIORITY

This application claims priority to Chinese Application No. 201310167401.1 entitled "A SLEEP MODE CIRCUIT AND A METHOD FOR PLACING A CIRCUIT INTO SLEEP MODE", filed on May 8, 2013 by Beken Corporation, which is incorporated herein by reference.

TECHNICAL FIELD

The present application relates to a circuit and a method, and more particularly but not limited to the sleep mode circuit and the method for placing a circuit into sleep mode.

BACKGROUND

In a wireless application product, in order to reduce power consumption in idle mode (also called sleep mode) for digital circuit, it is common to use a gated clock with low frequency, and to wait for a wakeup event of a user. However, as digital circuits increase in size, sleep mode power consumption is no longer negligible.

SUMMARY OF THE INVENTION

According to an embodiment, a first circuit is configured to communicatively couple to a second circuit including an analog circuit and a digital circuit. The first circuit comprises: a lock unit and a sleep unit. The lock unit is configured to receive a lock enable signal and to receive and lock a configuration signal of the digital circuit in response to the lock enable signal. The sleep unit is configured to receive a sleep triggering signal indicating to switch into sleep mode and to generate an off signal to switch off the digital circuit in response to the sleep triggering signal, while the analog circuit remains on.

According to another embodiment, there is provided a method in a first circuit configured to communicatively couple to a second circuit including an analog circuit and a digital circuit. The method comprises: receiving a lock enable signal; locking a configuration signal of the digital circuit in response to the lock enable signal; receiving a sleep triggering signal indicating to switch into sleep mode; generating an off signal to switch off power of the digital circuit in response to the sleep triggering signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details.

Additionally, some well-known structures or functions may not be shown or described in detail, so as to avoid unnecessarily obscuring the relevant description.

Figure 1:
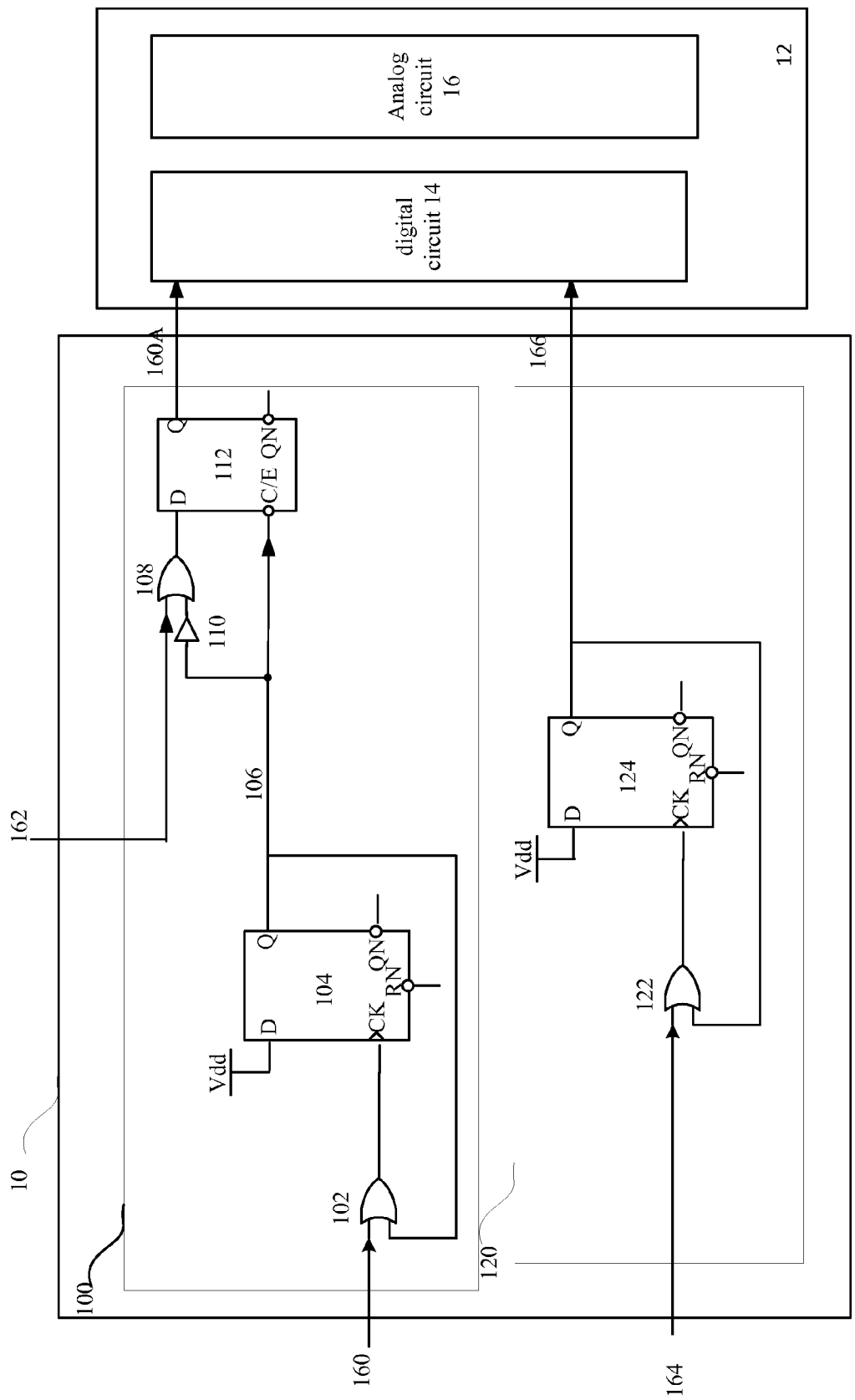
FIG. 1 shows a block diagram of a circuit according to an embodiment of the present invention.

FIG. 1 shows a block diagram of a circuit according to an embodiment of the present invention.

As shown in FIG. 1, a first circuit 10 is configured to communicatively couple to a second circuit 12. The second circuit 12 includes an analog circuit 16 and a digital circuit 14. The first circuit 10 comprises a lock unit 100 configured to receive a lock enable signal 160 and to receive and lock a configuration signal 162 of the digital circuit 14 in response to the lock enable signal 160. As shown in FIG. 1, the configuration signal locked by the lock enable signal 160 is locked configuration signal 160A. The first circuit 10 further comprises a sleep unit 120 configured to receive a sleep triggering signal 164 indicating to switch into sleep mode; and to generate an off signal 166 to switch off the digital circuit 14 in response to the sleep triggering signal 164. The physical details of lock unit 100, for example, will be discussed with reference to FIG. 2A and the physical details of the sleep unit 120, for example, will be discussed with reference to FIG. 3.

Figure 1A:
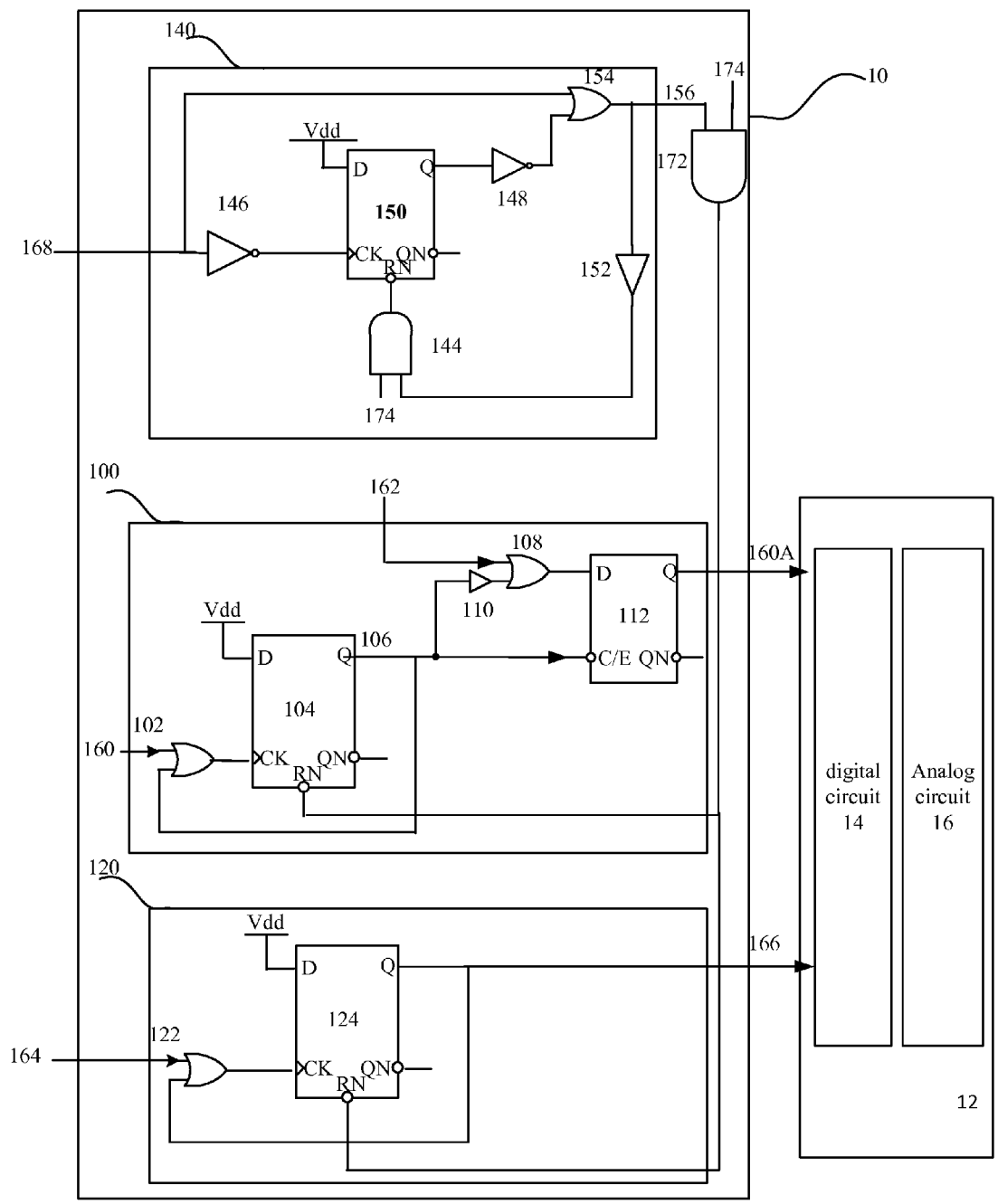
FIG. 1A shows a block diagram of a circuit according to another embodiment of the present invention.

Alternatively, as shown in FIG. 1A, the first circuit 10A further comprises a wakeup unit 140 configured to receive a wakeup signal 168. The wakeup unit 140 is further configured to reset the lock unit 100 and to reset the sleep unit 120 so as to unlock the locked configuration signal 160A of the digital circuit 14, and to supply power to the digital circuit 14 in response to the wakeup signal 168. The physical details of lock unit 100, for example, will be discussed with reference to FIG. 2A and the physical details of the sleep unit 120, for example, will be discussed with reference to FIG. 3. The physical details of wakeup unit 140, for example, will be discussed with reference to FIG. 5.

Figure 2:
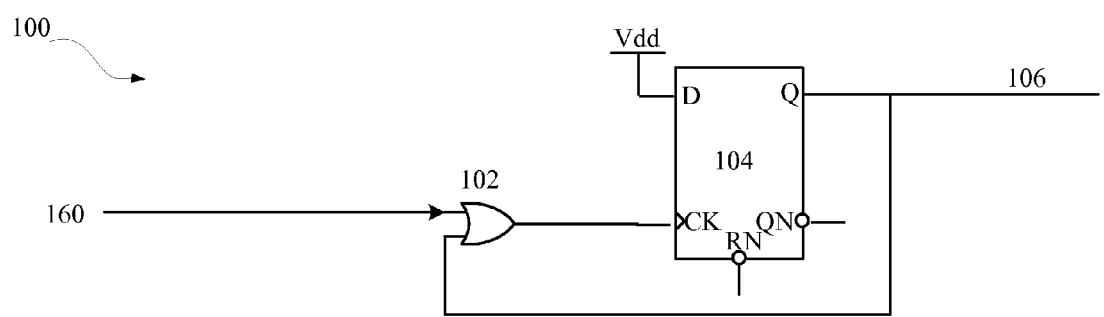
FIG. 2 shows a circuit diagram of the locking unit according to an embodiment of the invention.

FIG. 2 shows a circuit diagram of the locking unit according to an embodiment of the invention. As shown in FIG. 2, the lock unit 100 further comprises a first OR 102 gate, and a first D-type flip flop (DFF) 104. The D-type flip-flop, also known as a data or delay flip-flop, captures the value of the D-input at D port at a definite portion of the clock cycle (such as the rising edge of the clock). The captured value becomes the Q output at Q port. At other times, the output Q does not change. A first input port of the first OR 102 is configured to receive the lock enable signal 160. A second input port of the first OR 102 is connected to a Q port of the first D-type flip flop 104. An output port of the first OR 102 is connected to a clock port of the first D-type flip flop 104. A D port of the first D-type flip flop is connected to a power supply (Vdd) which is identified as logic "1". The Q port of the first D-type flip flop 104 includes a lock latch signal 106.

In normal active operation, the lock enable signal 160 is set to 0, and the configuration signal is not locked. When the configuration signals need to be locked, for example, the first circuit receives a sleep trigger signal 164, the lock enable signal 160 changes to 1. When the clock port (CK) changes from 0 to 1, that is the rising edge of the clock, the value of the D port, that is Vdd which is identified as logic "1", is captured and becomes the value of Q port. Therefore, the value of Q port, that is the lock latch signal 106, becomes 1.

Figure 2A:
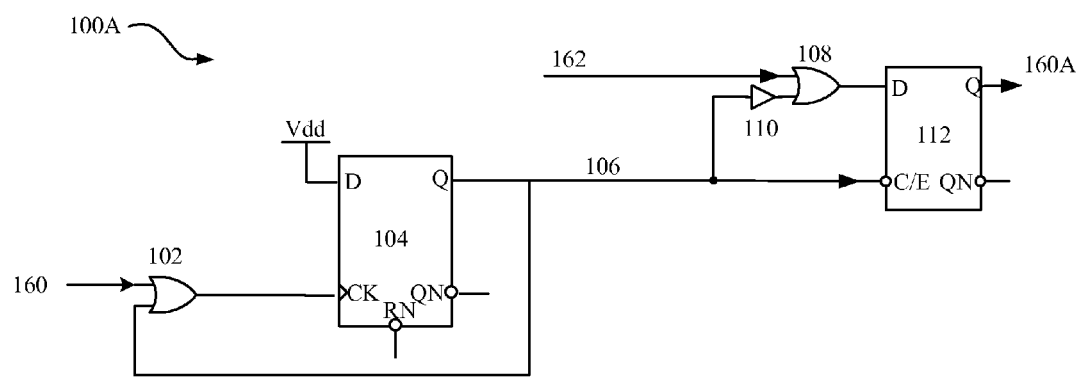
FIG. 2A shows a circuit diagram of the locking unit according to another embodiment of the invention.

In an alternated embodiment, as shown in FIG. 2A, the lock unit 100A further comprises a second OR gate 108, a first delay unit 110 and a D-type latch 112. The D-type latch 112 has a data input (D) and an enable signal (sometimes named clock, or control input, as represented with C/E in FIG. 2A). When the enable input is on, the signal propagates directly through the circuit, from the input D to the output Q. The first delay unit 110 is configured to delay the lock latch signal 106. A first input port of the second OR gate 108 is connected to an output port of the first delay unit 110. A second input port of the second OR gate 108 is connected to the configuration signal 162 of the digital circuit 14. An output port of the second OR gate 108 is connected to a D port of the D-type latch 112. The lock latch signal 106 is transmitted to a clock/enable (C/E) port of the D-type latch 112. A Q port of the D-type latch 112 is configured to output locked configuration signal 160A of the digital circuit 14 to the digital circuit 14.

In the circuit shown in FIG. 2A, since the D-latch 112 is low-active, during normal active operation, the lock latch signal 106 is set to 0, then the Q port of the D-type latch 112 equals the D port of the D-type latch 112, therefore the configuration signal 162 will pass through the D-type latch transparently. However, when the lock latch signal 106 changes to 1, then the D-latch 112 is locked, and the Q port of the D-type latch 112 will not change.

Figure 2B:
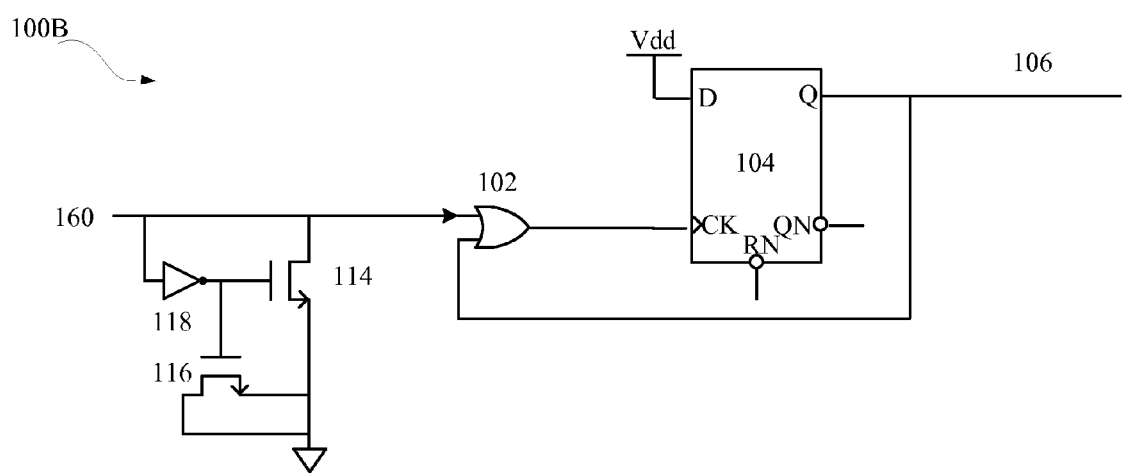
FIG. 2B shows a circuit diagram of the locking unit according to another embodiment of the invention.

In another embodiment, as shown in FIG. 2B, the lock unit 100B further comprises a first inverter 118, a first NMOS 114 and a second NMOS 116. An input port of the first inverter 118 is configured to receive the lock enable signal 160. An output port of the first inverter 118 is connected to common gates of the first and the second NMOSs 114 and 116. A drain of the first NMOS 114 is connected to the first input port of the first OR gate 102. A source of the first NMOS 114, a source and a drain of the second NMOS 116 are all connected to ground (GND, which is identified as logic "0"). When the lock enable signal 160 changes from logic 1 to logic 0, the first inverter 118, the first and the second NMOS 114 and 116 are configured to provide a channel to quickly discharge electricity. Therefore, the conversion from logic 1 to logic 0 is fast, and the intermediate status between 0 and 1 is transient.

Figure 3:
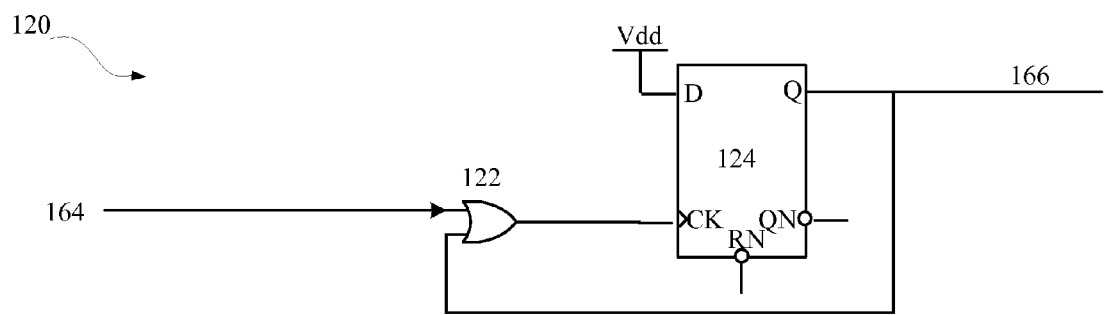
FIG. 3 shows a circuit diagram of the sleep unit according to an embodiment of the invention.

FIG. 3 shows a circuit diagram of the sleep unit 120 according to an embodiment of the invention. The sleep unit 120 further comprises a third OR gate 122, and a second D-type flip flop 124. A first input port of the third OR 122 is configured to receive the sleep triggering signal 164. A second input port of the third OR 122 is connected to a Q port of the second D-type flip flop 124. An output port of the third OR 122 is connected to a clock port of the second D-type flip flop 124, a D port of the second D-type flip flop 124 is connected to a power supply (Vdd, which is identified as logic "1"), and the Q port of the second D-type flip flop 124 includes the off signal 166.

Figure 3A:
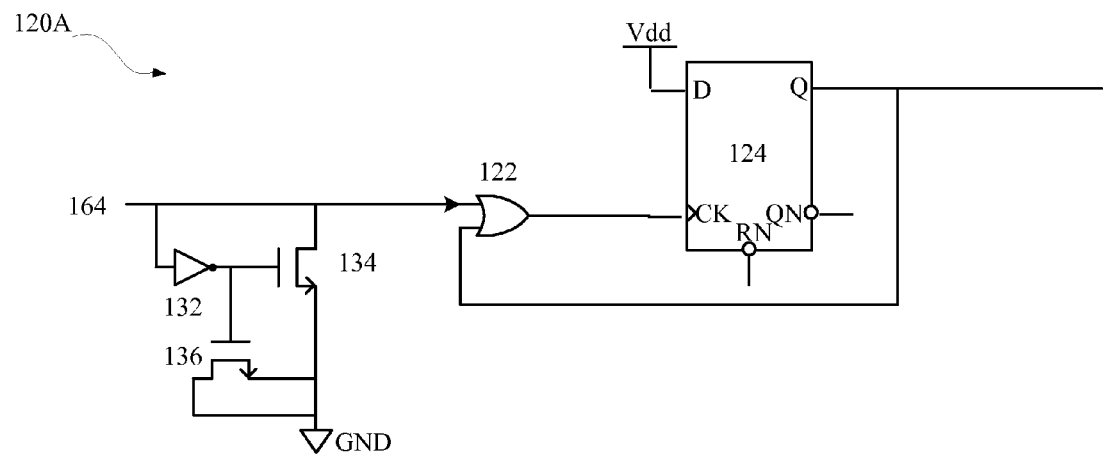
FIG. 3A shows a circuit diagram of the sleep unit according to an alternative embodiment.

FIG. 3A shows a circuit diagram of the sleep unit 120A according to an alternative embodiment. As shown in FIG. 3A, the sleep unit 120A further comprises a second inverter 132, a third NMOS 134 and a fourth NMOS 136. An input port of the second inverter 132 is configured to receive the sleep triggering signal 164. An output port of the second inverter 132 is connected to common gates of the third and the fourth NMOSs 134 and 136. A drain of the third NMOS 134 is connected to the first input port of the third OR gate 122. A source of the third NMOS 134, a source and a drain of the fourth NMOS 136 are all connected to ground (GND), which is identified as logic "0".

Figure 4:
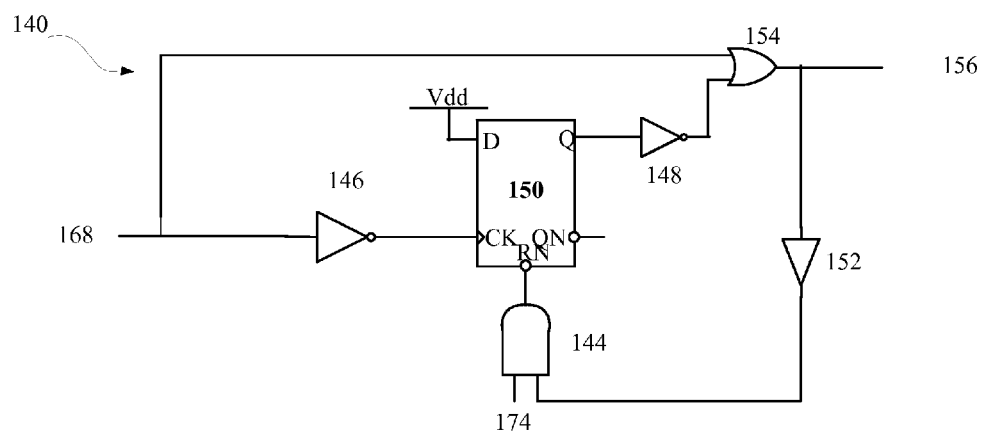
FIG. 4 shows a circuit diagram of a wakeup unit according to an embodiment of the present invention.

FIG. 4 shows a circuit diagram of a wakeup unit 140 according to an embodiment of the present invention. The wakeup unit 140 further comprises a first AND gate 144, a third inverter 146 and a fourth inverter 148, a third D-type flip flop 150, a fourth OR gate 154 and a second delay unit 152. An input port of the third inverter 146 is configured to receive the wakeup signal 168. An output port of the third inverter 146 is connected to a clock port of the third D-type flip flop 150. A D port of the third D-type flip flop 150 is connected to a power supply (Vdd, which is identified as logic "1"). A Q port of the third D-type flip flop 150 is connected to an input port of the fourth inverter 148. An output of the fourth inverter 148 is connected to a first input of the fourth OR gate 154. A second input of the fourth OR gate 154 is configured to receive the wakeup signal 168. An output of the fourth OR gate 154 is connected to an input port of the second delay unit 152. An output port of the second delay unit 152 is connected to a first input of the first AND gate 144. A second input of the first AND 144 gate receives a power on reset signal 174. The power on reset signal 174 resets when the whole chip powers on. An output of the first AND gate 144 is connected to reset port of the third D-type flip flop 150, wherein the output of the fourth OR gate 154 comprises a wakeup reset signal 156. The second delay unit 152 is configured to delay the wakeup reset signal 156 and then transmit the delayed wakeup reset signal 156 to the reset port of the third D-type flip flop 150.

The wakeup reset signal 156 is used to generate a reset signal. In normal active operation, the wakeup reset signal 156 is set to 1. If a wakeup event occurs, the wakeup signal 168 is set to 0, and the wakeup signal 168 is input into the inverter 146. After the inverter 146, the signal becomes 1. When 1 is input to the clock port of the D-type flip flop 150, a rising edge is met, then 1 is output on the Q port of the D-type flip flop 150. After the inversion by the inverter 148, 0 is output by the output of the inverter 148, which is then input to a first input port of the fourth OR gate 154. Since the wakeup signal 168 is input into a second input out of the fourth OR gate, then the output port of the fourth OR gate outputs 0.

Figure 4A:
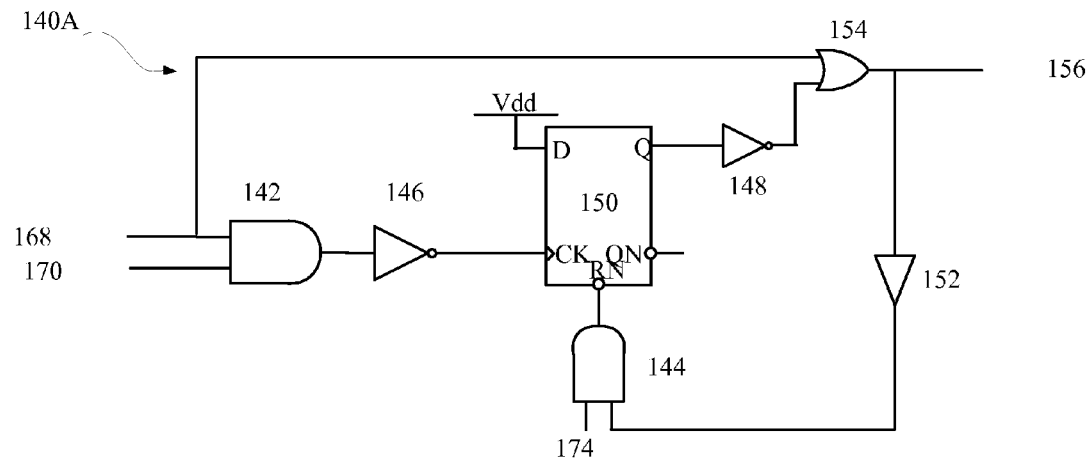
FIG. 4A shows a circuit diagram of the wakeup circuit according to an alternative embodiment of the invention.

FIG. 4A shows a circuit diagram of the wakeup circuit 140A according to an alternative embodiment of the invention. As shown in FIG. 4A, the wakeup circuit 140A further comprises a second AND gate 142. The second AND gate 142 is configured to receive the wakeup signal 168 via a first input port of the second AND gate 142. The second AND gate 142 is further configured to receive a wakeup enable signal 170 via a second input port of the second AND gate 142. An output port of the second AND gate 142 is connected to the third inverter 146. Therefore, when the wakeup enable signal 170 is set to 1, then the wakeup signal 168 is enabled, which means that, the value of the wakeup signal 168 will have an influence on the wakeup reset signal 156. To be specific, when the wakeup enable signal 170 is set to 1 and the wakeup signal 168 is set to 0, the wakeup reset signal 156 is generated. Otherwise, if the wakeup enable signal 170 is set to 0, then the wakeup signal 168 is disabled, which means that no matter whether the wakeup signal 168 is 0 or 1, the wakeup signal 168 will not generate the wakeup reset signal 156.

Figure 5:
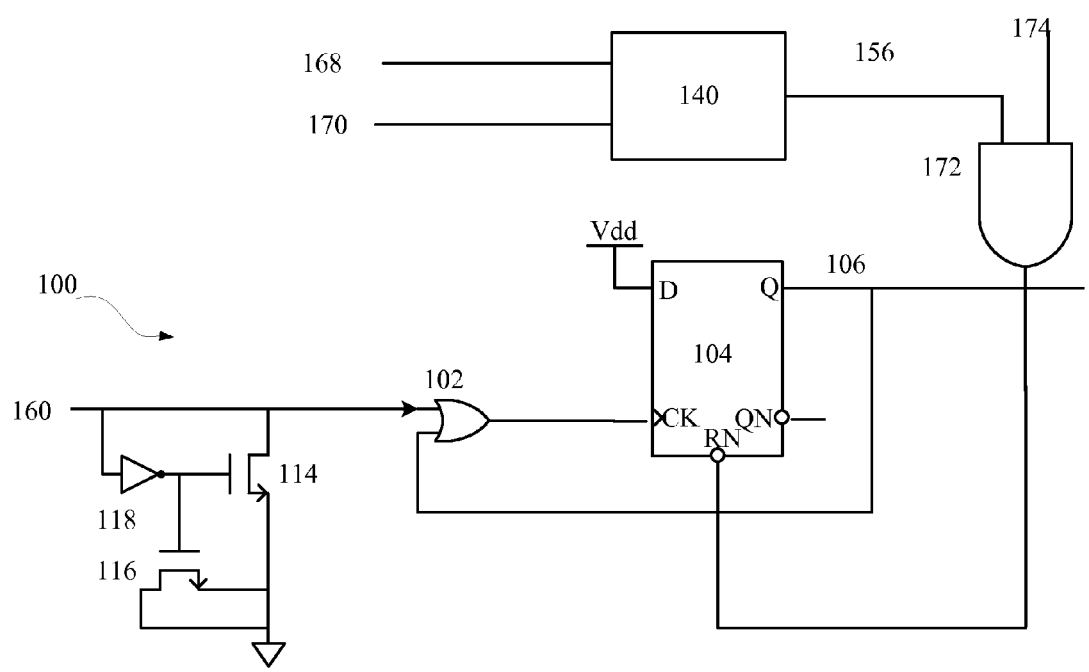
FIG. 5 shows a circuit diagram including the lock unit and the wakeup circuit 140 according to an embodiment of the present invention.

FIG. 5 shows a circuit diagram including the lock unit 100 and the wakeup circuit 140 according to an embodiment of the present invention. As shown in FIG. 5, the circuit 10 further comprises a third AND gate 172. A first input port of the third AND gate 172 is configured to receive the wakeup reset signal 156. A second input port of the third AND gate 172 is configured to receive a power on reset signal 174. An output of the third AND 172 is connected to the reset port of the first D-type flip flop 104 of the lock unit 100. The third AND gate 172 is configured to reset the first D-type flip flop 104, so as to set the lock latch signal 106 to 0.

Figure 6:
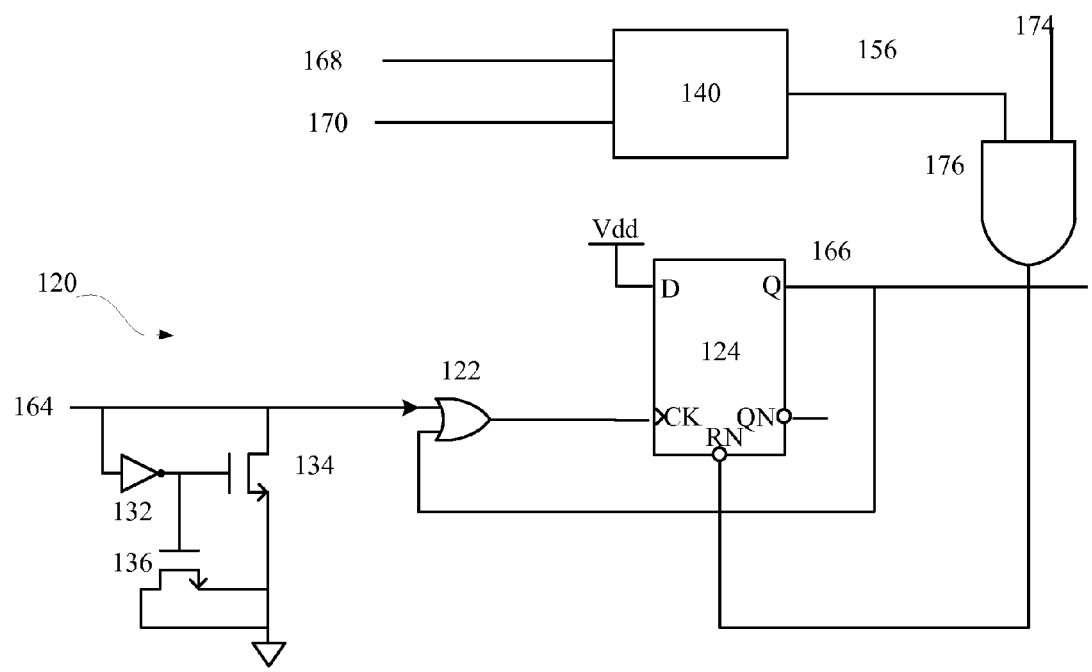
FIG. 6 shows a circuit diagram including the sleep unit and the wakeup circuit 140 according to an embodiment of the present invention.

FIG. 6 shows a circuit diagram including the sleep unit 120 and the wakeup circuit 140 according to an embodiment of the present invention. As shown in FIG. 6, the circuit 10 further comprises a fourth AND gate 176. A first input port of the fourth AND gate 176 is configured to receive the wakeup reset signal 156. A second input port of the fourth AND gate 176 is configured to receive a power on reset signal 174. An output of the fourth AND 176 is connected to the reset port of the second D-type flip flop 124 of the sleep unit 120. The fourth AND gate 176 is configured to reset the second D-type flip flop 124, so as to set the off signal 166 to 0.

Figure 7:
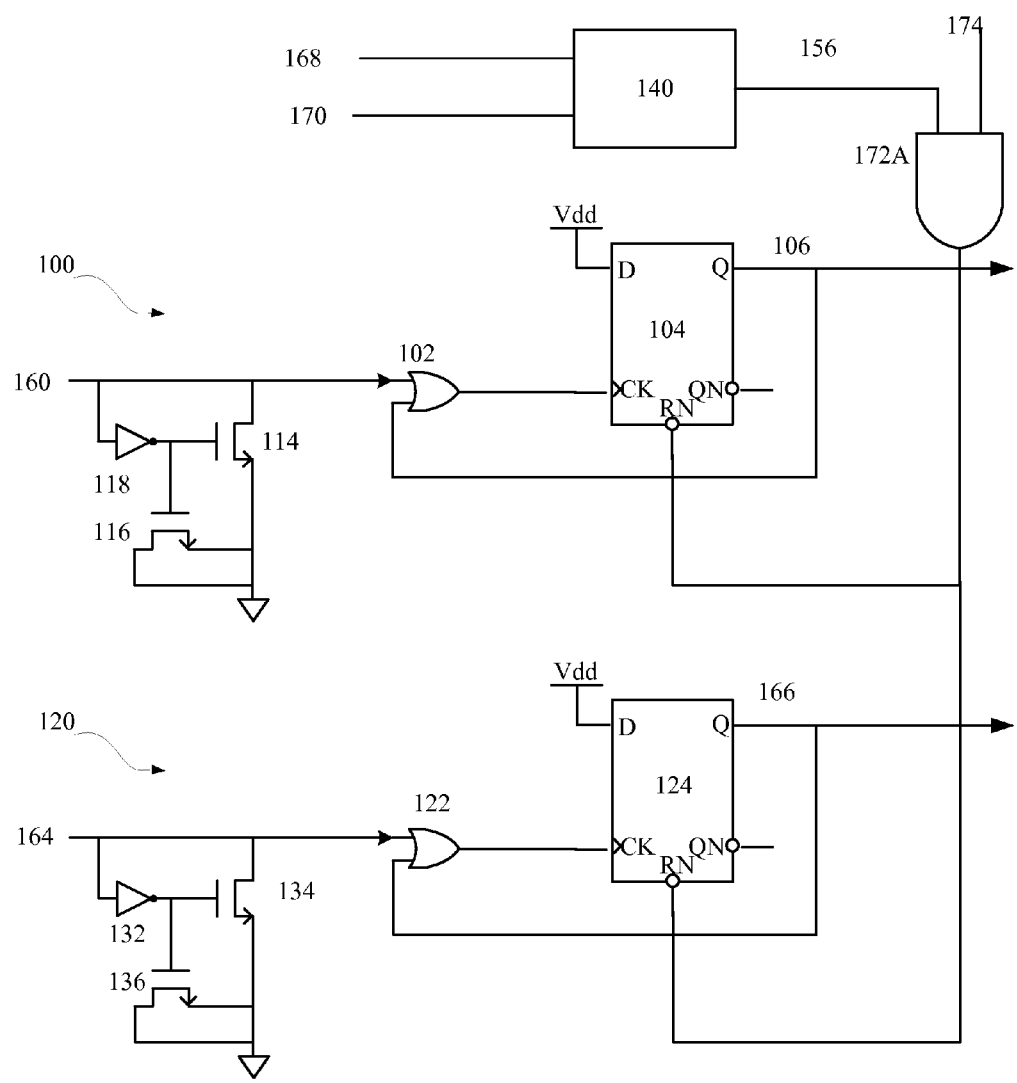
FIG. 7 shows a circuit diagram including the lock unit, the sleep unit and the wakeup circuit according to an embodiment of the present invention.

FIG. 7 shows a circuit diagram including the lock unit 100, the sleep unit 120 and the wakeup circuit 140 according to an embodiment of the present invention. As shown in FIG. 7, the third AND gate 172 and the fourth AND gate 176 can be implemented as one AND gate 172A. The AND gate 172A is configured to simultaneously control the reset of the lock unit 100 and the sleep unit 120.

In one embodiment, the configuration signal of the digital circuit comprises a configuration signal for peripheral I/O interfaces of the digital circuit, a configuration signal for specific module circuit, or a configuration signal for ROM.

In one embodiment, the wakeup signal 168 comprises an incoming call or a user input.

Figure 8:
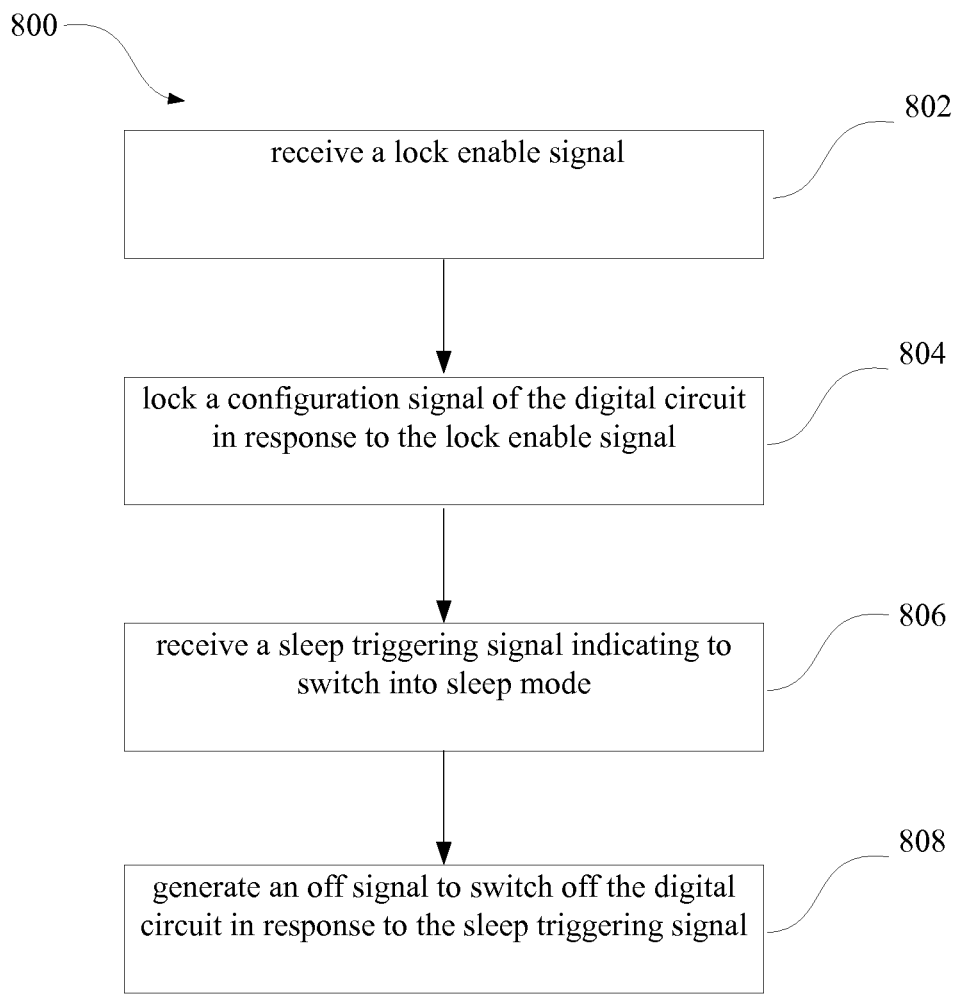
FIG. 8 shows a flow chart of the method according to an embodiment of the invention.

FIG. 8 shows a flow chart of a method 800 according to an embodiment of the invention. The method 800 operates in a first circuit 10 configured to communicatively couple to a second circuit 12 including an analog circuit 16 and a digital circuit 14. The method 800 comprises, in block 802, receiving a lock enable signal. In block 804, a configuration signal of the digital circuit is locked in response to the lock enable signal. In block 806, a sleep triggering signal indicating to switch into sleep mode is received. In block 808, an off signal to switch off the digital circuit in response to the sleep triggering signal is generated.

Figure 8A:
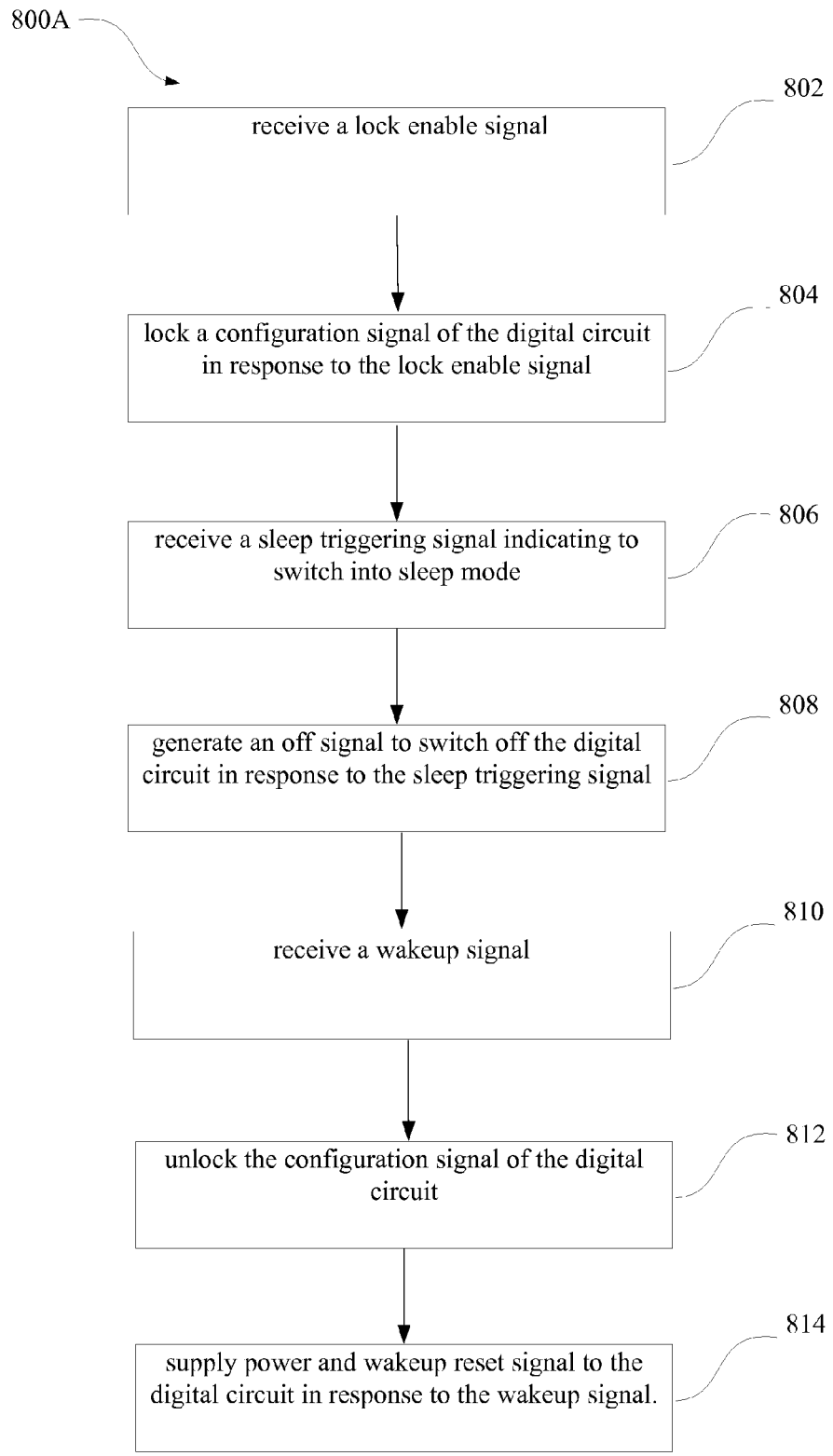
FIG. 8A shows a flow chart of the method according to another embodiment of the invention.

FIG. 8A shows a flow chart of a method 800A according to another embodiment of the invention. Alternatively, as shown in FIG. 8A, after block 808 of generating an off signal to switch off the digital circuit in response to the sleep triggering signal, the method 800A further comprises, in block 810, receiving a wakeup signal. In block 812, the configuration signal of the digital circuit is unlocked. In block 814, power and a wakeup reset signal are supplied to the digital circuit in response to the wakeup signal. Those skilled in the art can understand that the block 812 and the block 814 do not have to be performed in the order recited. That is to say block 812 and block 814 can be implemented simultaneously, or asynchronously in different order.

Figure 8B:
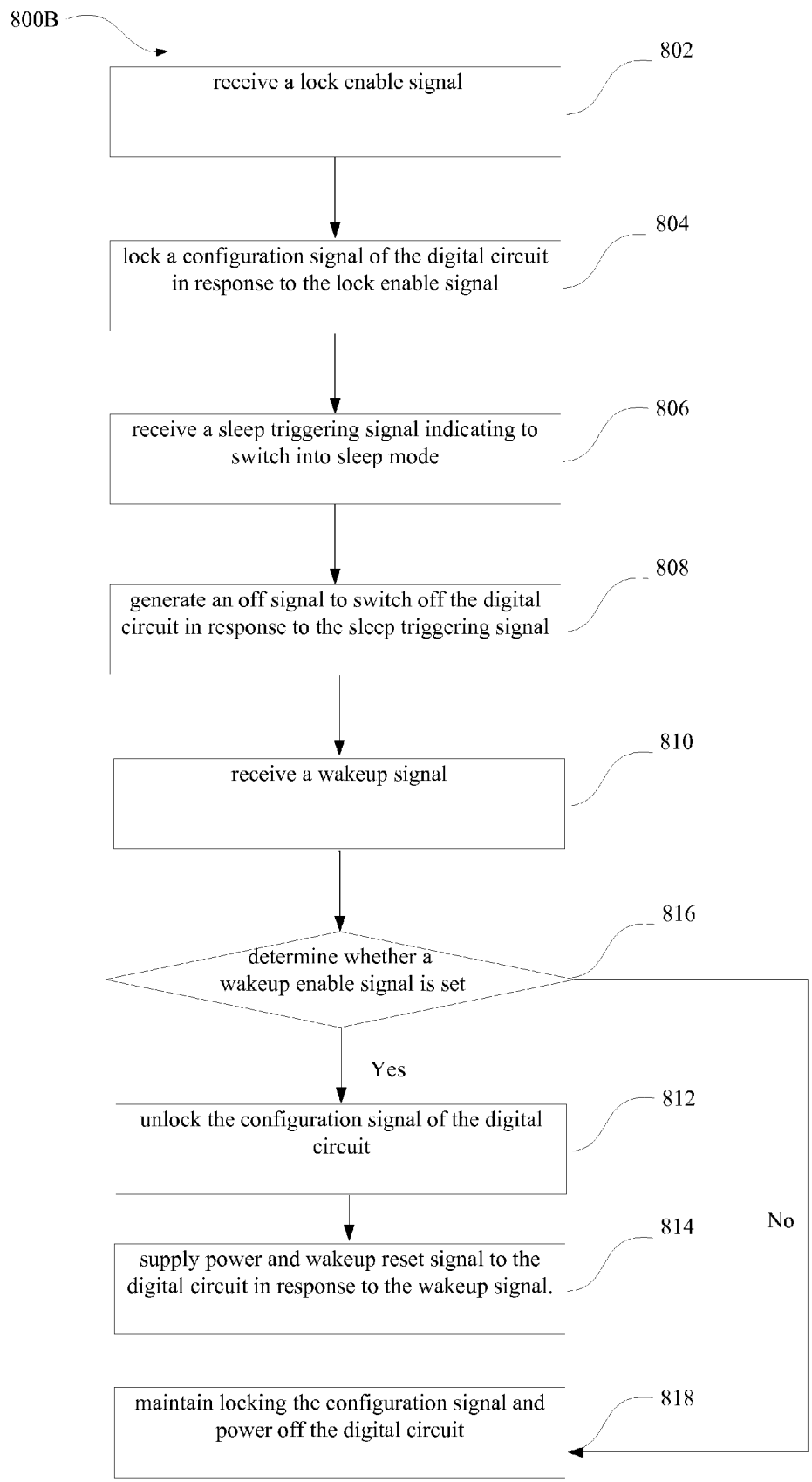
FIG. 8B shows a flow chart of the method according to another embodiment of the invention.

FIG. 8B shows a flow chart of the method 800B according to another embodiment of the invention. Alternatively, as shown in FIG. 8B, before unlocking the configuration signal in block 812, the method 800B further comprises: in block 816, determining whether a wakeup enable signal is set. The method 800B further comprises executing the unlocking the configuration signal and supplying power if the wakeup enable signal is set; or in block 818, the method 800B comprises maintaining locking the configuration signal and power off the digital circuit if the wakeup enable signal is not set.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A first circuit configured to communicatively couple to a second circuit including an analog circuit and a digital circuit, the first circuit comprising:
   a lock unit configured to receive a lock enable signal and to receive and lock a configuration signal of the digital circuit in response to the lock enable signal;
   a sleep unit configured to receive a sleep triggering signal indicating to switch into sleep mode; and to generate an off signal to switch off the digital circuit in response to the sleep triggering signal, while the analog circuit remains on;
   wherein the lock unit further comprises a first OR gate, and a first D-type flip flop, wherein
   a first input port of the first OR is configured to receive the lock enable signal, a second input port of the first OR is connected to a Q port of the first D-type flip flop; an output port of the first OR is connected to a clock port of the first D-type flip flop, a D port of the first D-type flip flop is connected to a power supply (Vdd), and the Q port of the first D-type flip flop includes a lock latch signal.

2. The circuit according to claim 1, further comprising:
   a wakeup unit configured to receive a wakeup signal; and to reset the lock unit and to reset the sleep unit so as to unlock the locked configuration signal of the digital circuit and to supply power to the digital circuit in response to the wakeup signal.

3. The circuit of claim 2, wherein the wakeup signal comprises an incoming call or a user input.

4. The circuit of claim 1, wherein the lock unit further comprises a second OR gate, a first delay unit and a D-type latch, wherein
   the first delay unit is configured to delay the lock latch signal, a first input port of the second OR gate is connected to an output port of the first delay unit, a second input port of the second OR gate is connected to the configuration signal of the digital circuit, an output port of the second OR gate is connected to a D port of the D-type latch, the lock latch signal is connected to a clock/enable port of the D-type latch, a Q port of the D-type latch is configured to output locked configuration signal of the digital circuit to the digital circuit.

5. The circuit of claim 1, wherein the lock unit further comprises a first inverter, a first NMOS and a second NMOS, wherein
an input port of the first inverter is configured to receive the lock enable signal, an output port of the first inverter is connected to common gates of the first and the second NMOSs, a drain of the first NMOS is connected to the first input port of the first OR gate, a source of the first NMOS, a source and a drain of the second NMOS are all connected to ground.

6. The circuit of claim 1, wherein the configuration signal of the digital circuit comprises configuration signal for peripheral I/O interfaces of the digital circuit, configuration signal for specific module circuit, or configuration signal for ROM.

7. A first circuit configured to communicatively couple to a second circuit including an analog circuit and a digital circuit, the first circuit comprising:
a lock unit configured to receive a lock enable signal and to receive and lock a configuration signal of the digital circuit in response to the lock enable signal;
a sleep unit configured to receive a sleep triggering signal indicating to switch into sleep mode; and to generate an off signal to switch off the digital circuit in response to the sleep triggering signal, while the analog circuit remains on;
wherein the sleep unit further comprises a third OR gate, and a second D-type flip flop, wherein
a first input port of the third OR is configured to receive the sleep triggering signal, a second input port of the third OR is connected to a Q port of the second D-type flip flop; an output port of the third OR is connected to a clock port of the second D-type flip flop, a D port of the second D-type flip flop is connected to a power supply (Vdd), and the Q port of the second D-type flip flop includes the off signal.

8. The circuit of claim 7, wherein the sleep unit further comprises a second inverter, a third NMOS and a fourth NMOS, wherein
an input port of the second inverter is configured to receive the sleep triggering signal, an output port of the second inverter is connected to common gates of the third and the fourth NMOSs, a drain of the third NMOS is connected to the first input port of the third OR gate, a source of the third NMOS, a source and a drain of the fourth NMOS are all connected to ground.

9. A first circuit configured to communicatively couple to a second circuit including an analog circuit and a digital circuit, the first circuit comprising:
a lock unit configured to receive a lock enable signal and to receive and lock a configuration signal of the digital circuit in response to the lock enable signal;
a sleep unit configured to receive a sleep triggering signal indicating to switch into sleep mode; and to generate an off signal to switch off the digital circuit in response to the sleep triggering signal, while the analog circuit remains on;
wherein the first circuit further comprises:
a wakeup unit configured to receive a wakeup signal; and to reset the lock unit and to reset the sleep unit so as to unlock the locked configuration signal of the digital circuit and to supply power to the digital circuit in response to the wakeup signal;
wherein the wakeup unit further comprises a first AND gate, a third inverter and a fourth inverter, a third D-type flip flop, a fourth OR gate, and a second delay unit,
an input port of the third inverter is configured to receive the wakeup signal, an output port of the third inverter is connected to a clock port of the third D-type flip flop, a D port of the third D-type flip flop is connected to a power supply (Vdd), a Q port of the third D-type flip flop is connected to an input port of the fourth inverter, an output of the fourth inverter is connected to a first input of the fourth OR gate, a second input of the fourth OR gate is configured to receive the wakeup signal, an output of the fourth OR gate is connected to an input port of the second delay unit, an output port of the second delay unit is connected to a first input of the first AND gate, a second input of the first AND gate is configured to receive a power on reset signal, and an output of the first AND gate is connected to reset port of the third D-type flip flop, wherein the output of the fourth OR gate comprises a wakeup reset signal.

10. The circuit of claim 9, wherein the wakeup unit further comprises:
a second AND gate configured to receive the wakeup signal via a first input port of the second AND gate and to receive a wakeup enable signal via a second input port of the second AND gate, and an output port of the second AND gate is connected to an input port of the third inverter.

11. The circuit of claim 9, wherein the circuit further comprises a third AND gate, wherein
a first input port of the third AND gate is configured to receive the wakeup reset signal, a second input port of the third AND gate is configured to receive a power on reset signal, and an output of the third AND is connected to the reset port of the first D-type flip flop of the lock unit.

12. The circuit of claim 9, wherein the circuit further comprises a fourth AND gate, wherein
a first input port of the fourth AND gate is configured to receive the wakeup reset signal, a second input port of the fourth AND gate is configured to receive a power on reset signal, and an output of the fourth AND is connected to the reset port of the second D-type flip flop of the sleep unit.

* * * * *